(12) United States Patent
Iwashita et al.

(10) Patent No.: US 6,660,941 B2
(45) Date of Patent: Dec. 9, 2003

(54) ELECTRONIC PARTS MOUNTING BOARD AND PRODUCTION METHOD THEREOF

(75) Inventors: Sakan Iwashita, Kanagawa (JP); Haruhiko Makino, Kanagawa (JP); Hidetoshi Kusano, Kanagawa (JP)

(73) Assignee: Sony Corporation, Tokyo (JP)

( * ) Notice: Subject to any disclaimer, the term of this patent is extended or adjusted under 35 U.S.C. 154(b) by 8 days.

(21) Appl. No.: 10/080,313

(22) Filed: Feb. 21, 2002

(65) Prior Publication Data

US 2002/0112879 A1 Aug. 22, 2002

(30) Foreign Application Priority Data

Feb. 21, 2001 (JP) ...................................... P2001-045807

(51) Int. Cl.[7] ................................................. H05K 1/00
(52) U.S. Cl. ........................ 174/250; 174/266; 174/267
(58) Field of Search ........................ 174/250, 258–267, 174/255; 361/760, 767–768, 789–795, 761, 772–774; 257/775–776

(56) References Cited

U.S. PATENT DOCUMENTS

| | | | | |
|---|---|---|---|---|
| 5,329,423 A | * | 7/1994 | Scholz | 361/760 |
| 5,795,818 A | * | 8/1998 | Marrs | 438/612 |
| 5,874,780 A | * | 2/1999 | Murakami | 257/775 |
| 6,163,957 A | * | 12/2000 | Jiang et al. | 29/852 |
| 6,294,745 B1 | * | 9/2001 | Gruber | 174/263 |

* cited by examiner

Primary Examiner—Kamand Cuneo
Assistant Examiner—Tuan Dinh
(74) Attorney, Agent, or Firm—Sonnenschein, Nath & Rosenthal LLP

(57) ABSTRACT

An electronic parts mounting board includes an electrode circuit base member having electrodes on at least one surface; projecting electrodes bonded to the electrodes of the electrode circuit base member; an insulating member provided on the electrode circuit base member in such a manner as to insulate the electrodes of the electrode circuit base member and the projecting electrodes; and circuit electrode patterns provided on the insulating member and the projecting electrodes. In this mounting board, the projecting electrodes are formed by forming specific projecting conductive members at specific positions of the circuit electrode patterns by plating, and pressing the projecting conductive members in the insulating member so as to pass through the insulating member and reach the electrodes of the electrode circuit base member. The mounting board is capable of connecting circuit electrode patterns to a specific electrode base member via small contacts comparable to those obtained by a photo via process at a high positional accuracy, and improving the flatness and adhesive force of the circuit electrode patterns, without use of an expensive laser system for drilling.

8 Claims, 7 Drawing Sheets

ELECTRONIC PARTS MOUNTING BOARD AND PRODUCTION METHOD THEREOF

BACKGROUND OF THE INVENTION

The present invention relates to a NEW-TAB (Tape Automated Bonding) technology and a UFPL (Ultra Fine Pattern Lead-flame) technology, and particularly to an electronic parts mounting board suitable for a multilayer wiring board (buildup board) to be mounted on portable terminal devices, portable telephones, etc., and a method of producing the electronic parts mounting board.

Recently, in an information communication field, portable telephones, portable game devices, etc. having various functions in addition to a communication function have come to be frequently used along with development of multi-media. These portable terminal devices, etc. often use multilayer wiring boards on each of which a large number of electronic parts and wiring patterns for realizing a communication function, an information retrieving function, etc. are mounted.

Such a multilayer wiring board has required lightweightness and miniaturization, and has used an organic board having copper foils on both surfaces as a base board. The organic board is obtained by coating a glass fiber cloth called a glass epoxy prepreg with a semi-hardened epoxy resin.

A method of producing a multilayer board using such an organic board having copper foils on both surfaces includes the steps of coating the copper foils on both surfaces of the organic board with a resist and patterning the resist, removing an unnecessary copper foil by etching using the resist patterns as a mask, to form wiring patterns, forming contact holes passing through the organic board at specific positions of the wiring patterns, burying the contact holes with copper by electroless copper plating, and connecting the wiring patterns on both the surfaces to each other through the contact holes. The wiring board thus obtained is bonded to another wiring board obtained in the same manner by means of a thermosetting insulating member, to obtain a multilayer wiring board.

The multilayer wiring board using the organic board having copper foils on both the surfaces, however, has problems. Since the thickness of the prepreg is large, the finish thickness of the wiring board becomes large as the number of stacked layers of the wiring board becomes large. Further, since contact holes are formed by using a drill, diameters of the contact holes become large and the contact holes occupy large areas, to thereby obstruct higher density mounting, and a relative positional relationship between the contact holes is varied. Even if the contact holes are formed by laser beam drilling, an expensive equipment investment is required.

To solve such a problem, a buildup board production technology has been developed for reducing sizes, weights and costs of multilayer wiring boards. This board production technology is classified into the following four types:

(1) Photo Via Process

This process is carried out by preparing a core member for an inner layer, on both surfaces of which wiring patterns have been formed, forming a photosensitive insulating resin layer on both the surfaces of the core member, patterning the resist by photolithography, to form a resist mask, forming openings (via-holes) reaching the wiring patterns at specific positions using the resist mask, burying the openings with copper by copper plating, thereby forming electrodes (through-holes) for connection. With this process, the openings can be collectively formed by photolithography, it is possible to enhance a relative positional accuracy between the openings, and to shorten the contacts and form relatively small openings at a high resolution.

(2) First Laser Via Process

This process is carried out by preparing a core member for an inner layer, on both surfaces of which wiring patterns have been formed, forming a thermosetting insulating resin layer on both the surfaces of the core member, curing the thermosetting resin, forming openings (blind via-holes) reaching the wiring patterns at specific positions by laser beam drilling, and burying the openings with copper by copper plating, thereby forming electrodes (through-holes) for connection. With this process, since the blind via-holes are formed by laser beam drilling, the wiring board is less affected by contamination, and thereby the works in a clean room can be eliminated.

(3) Second Laser Via Process

This process is carried out by preparing a core member for an inner layer, on both surfaces of which wiring patterns have been formed, adhesively bonding copper foils, each of which is coated with a thermosetting insulating resin, on both surfaces of the core member, curing the thermosetting insulating resin, forming openings (blind via-holes) reaching the wiring patterns through the copper foils at specific positions by laser beam drilling, and burying the openings with copper by copper plating, thereby forming electrodes (through-holes) for connection.

With this process, since the blind via-holes are formed by laser beam drilling, the same advantage as that obtained by the first laser via process can be obtained, and since irregularities of the core member are buried in the thermosetting insulating resin, there can be obtained advantages that a multilayer wiring board having a larger number of layers can be easily obtained because of no irregularities of each core member, and that an adhesive force between the core members can be improved.

(4) Buried Bump Interconnection Technology Process

FIG. 3 is a sectional view showing a configuration example of a related art multilayer wiring board. A multilayer wiring board 10 shown in FIG. 3 is formed by a buried bump interconnection technology process. The multilayer wiring board 10 includes a core member 1 having wiring patterns 3A to 3C on the back surface and electrodes 2A to 2C for connection on the inner layer side. Bump electrodes 4A to 4C are provided on the electrodes 2A to 2C of the core member 1, respectively. A thermosetting insulating resin layer 5 is provided on the core member 1 in such a manner as to insulate the bump electrodes 4A to 4C. Circuit electrode patterns 6A to 6C are provided on the thermosetting insulating resin layer 5 and the bump electrodes 4A to 4C, respectively.

The bump electrodes 4A to 4C are formed by overprinting (bump-printing) copper-containing conductive paste at specific positions of a copper foil 2 shown in FIG. 4A in a state before the circuit electrode patterns 6A to 6C are formed, to form conical conductive paste portions 4A' to 4C', curing the conical conductive paste portions 4A' to 4C', superimposing the core member 1, the thermosetting insulating resin layer 5, and the copper foil 2 with the conical conductive paste portions 4A' to 4C' as shown in FIG. 4B, and hot-pressing them in such a manner that the conical conductive paste portions 4A' to 4C' pass through the thermosetting insulating resin layer 5 and reach the electrodes 2A to 2C of the core member 1, respectively. With this process, it is possible to eliminate the work of forming openings for connection, enhancing a relative positional accuracy between the contacts, and shortening the contacts.

The above-described related art buried bump interconnection technology process, however, has a problem. The conical conductive paste portions 4A' to 4C' must be formed by bump-printing the conductive paste on the copper foil 2 in order to form the bump electrodes 4A to 4C. At this time, since the conductive paste must be overprinted, variations in widths and heights of the conductive paste portions may become large. As a result, it is difficult to form contacts having small diameters due to the limited accuracy of bump printing, thereby obstructing higher density mounting of a multi-layer wiring board. In addition, the other three processes have the following problems:

According to the photo via process, since the via-holes are formed by photolithography, the board is liable to be affected by contamination at the time of exposure, and therefore, the process must be performed in a controlled environment such as a clean room. Also, since the core member is coated with the photosensitive insulating resin, irregularities of the core member remain, so that it is difficult to accurately form a final pattern. Further, since the wiring patterns are formed only by subjecting the photosensitive insulating resin to copper plating, adhesive forces of the wiring patterns are weak.

According to the first and second laser via processes, since the blind via-holes are sequentially formed by laser beam drilling, a relative positional accuracy between the openings is reduced, and the contacts become short. Also, in the first laser via process, since the core member is coated with the thermosetting insulating resin, the irregularities of the core member remain, so that it is difficult to accurately form a final pattern. Further, since the wiring pattern is formed only by subjecting the photosensitive insulating resin to copper plating, adhesive forces of the wiring patterns are weak.

According to the second laser via process, since the openings reaching the wiring patterns are formed through the copper foils by laser beams, large energy beams are required, so that the work of forming openings having small diameters is complicated and an expensive laser beam drilling system is required.

In the above four processes, since circuit electrode patterns are formed by etching the copper foil, there is a limitation to finish accuracy of the wiring patterns, and therefore, in the case of applying the multilayer wiring board for a high frequency circuit, a special countermeasure such as impedance matching must be taken.

SUMMARY OF THE INVENTION

An object of the present invention is to provide an electronic parts mounting board capable of connecting circuit electrode patterns to a specific electrode circuit base member via small contacts comparable to those obtained by the photo via process at a high positional accuracy, and improving the flatness and adhesive force of the circuit electrode patterns, without use of an expensive laser system for drilling, and to provide a method of producing the electronic parts mounting board.

To achieve the above object, according to a first aspect of the present invention, there is provided an electronic parts mounting board including: an electrode circuit base member having an electrode on a surface of at least one side; a projecting electrode bonded to the electrode of the electrode circuit base member; an insulating member provided on the electrode circuit base member in such a manner as to insulate the electrode of the electrode circuit base member and the projecting electrode; and a circuit electrode pattern provided on the insulating member and the projecting electrode; wherein the projecting electrode is formed by forming a specific projecting conductive member at specific positions of the circuit electrode pattern by plating, and pressing the projecting conductive member into the insulating member so as to pass through the insulating member and reach the electrode of the electrode circuit base member.

With this configuration, since the circuit electrode pattern can be substantially integrated with the projecting electrode, and the projecting electrode thus integrated with the circuit electrode pattern can be bonded to the electrode of the electrode circuit base member, it is possible to provide an electronic parts mounting board having an electrode connection structure with a contact resistance almost negligible.

Since the irregularities such as the electrodes of the electrode circuit base member and the circuit electrode pattern can be buried in the insulating member, it is possible to provide an electronic parts mounting board of a very thin type which is excellent in flatness and adhesive force and is capable of increasing the mounting density. Such an electronic parts mounting board can be sufficiently applied to portable telephones and the like.

According to a second aspect of the present invention, there is provided a method of producing an electronic parts mounting board, including the steps of: forming a specific circuit electrode pattern on a surface of one side of a conductive base member to be plated and etched, by plating a specific conductive material thereon; selectively forming a non-plated material on the circuit electrode board on which the circuit electrode pattern has been formed; forming a projecting electrode for connection on the circuit electrode pattern by plating a specific conductive material on the circuit electrode pattern with the non-plated material used as a mask; after removing the non-plated material, putting an insulating thermal bonding member between the circuit electrode board and a specific electrode circuit base member, pressing the projecting electrode of the circuit electrode board into the thermal bonding member so as to reach the electrode circuit base member, to bond the circuit electrode board to the electrode circuit base member; and removing the conductive base member from a multilayer board obtained by bonding the circuit electrode board to the electrode circuit base member by selective etching.

With this configuration, blind contacts having small diameters comparable to those obtained by the photo via process can be obtained at a high relative positional accuracy without use of an expensive laser system for drilling, and the adhesive forces between the circuit electrode patterns and the projecting electrodes can be also significantly improved.

Since the conductive base member used as the temporary board is removed by overall etching from the multilayer wiring board obtained by bonding the circuit electrode board to the electrode circuit base member, it is possible to produce an electronic parts mounting board excellent in flatness and adhesive force and hence to sufficiently keep up with mass-production of electronic parts mounting boards such as buildup boards having blind contacts located at a high relative positional accuracy.

DETAILED DESCRIPTION OF THE PREFERRED EMBODIMENTS

Hereinafter, embodiments of an electronic parts mounting board and its production method of the present invention will be described with reference to the drawings.

Figure 1:
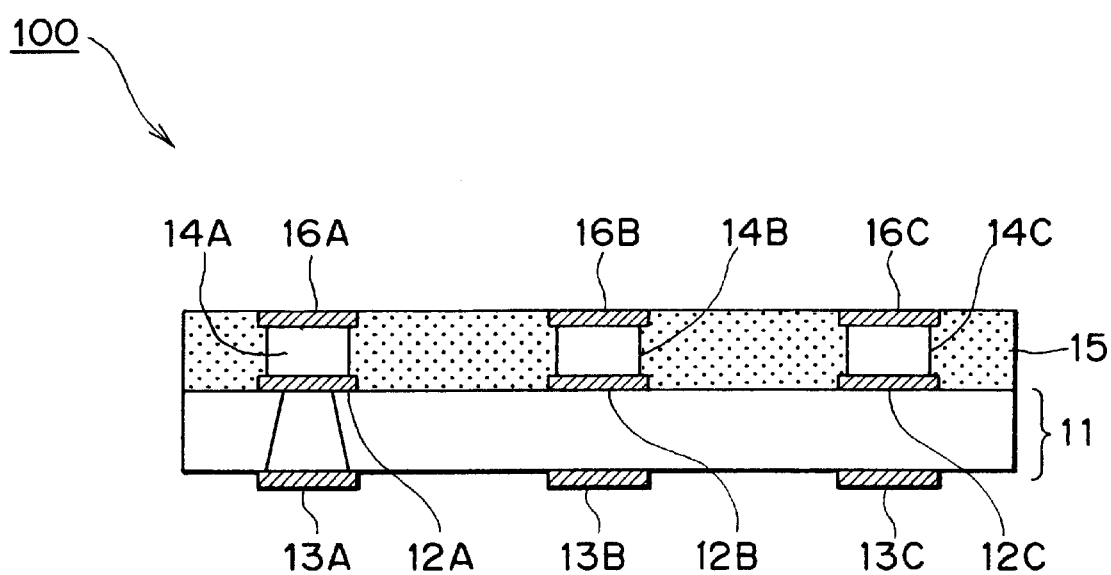
FIG. 1 is a sectional view showing a configuration of an electronic parts mounting board according to an embodiment of the present invention.

FIG. 1 is a sectional view showing a configuration of an electronic parts mounting board 100 according to an embodiment of the present invention.

According to this embodiment, an electronic parts mounting board is produced by plating a specific conductive material on circuit electrode patterns formed on a temporary circuit electrode board, to form projecting electrodes for connection thereon, putting an insulating thermal bonding member between the temporary circuit electrode board and a specific electrode circuit base member, and pressing the temporary circuit electrode board to the electrode circuit base member in such a manner that the projecting electrodes of the temporary circuit electrode board reach the electrode circuit base member, to bond the circuit electrode patterns to the electrode circuit base member. This embodiment, therefore, is intended to produce an electronic parts mounting board capable of connecting circuit electrode patterns to a specific electrode circuit base member with a high positional accuracy through contacts having small diameters comparable to those of contacts obtained by the photo via process, and improving the flatness and adhesive force of the circuit electrode patterns.

The electronic parts mounting board 100 shown in FIG. 1 is a buildup type multilayer wiring board suitable for use in portable telephones and portable terminal devices. The total thickness of the electronic parts mounting board 100 is in the order of about several millimeters while being dependent on the kind of a device to which the board 100 is applied and the number of stacked layers of the board 100. The electronic parts mounting board 100 has a core member 11 for an inner layer, which is one example of the above-described electrode circuit base member. The core member 11 has a plurality of electrodes 12A to 12C as contacts on at least one surface of the core member 11.

Projecting electrodes 14A, 14B and 14C are bonded to the electrodes 12A, 12B and 12C of the core member 11, respectively. An insulating member (hereinafter, referred sometimes to as "thermal bonding member") is provided on the core member 11 in such a manner as to cover these electrodes 12A to 12C and the projecting electrodes 14A to 14C. The insulating member 15 is made from a thermosetting insulating resin having an adhesive property. Circuit electrode patterns 13A, 13B and 13C are provided on a back surface of the core member 11.

Circuit electrode patterns 16A, 16B and 16C are provided on the insulating member 15 and the projecting electrodes 14A, 14B and 14C, respectively. The circuit electrode patterns 16A to 16C are obtained by plating a conductive material on a temporary conductive base member capable of being plated and etched with a non-plated member selectively formed on the temporary base member used as a mask, and removing the temporary conductive base member by selective etching (see FIGS. 2A to 2H).

With this configuration, since side edges of the circuit electrode patterns 16A to 16C can be shaped to be raised upright. Accordingly, as compared with circuit electrode patterns formed by etching a copper foil, the circuit electrode patterns 16A to 16C are excellent in skin effect. Such circuit electrode patterns are optimum for high frequency operation.

The projecting electrodes 14A to 14C are obtained by plating a specific conductive material on specific portions of the circuit electrode patterns 16A to 16C, respectively, to form projecting conductive members, and pressing the projecting conductive members in the insulating member 15 so as to pass through the insulating member 15 and reach the electrodes 12A to 12C of the core member 11, respectively. The circuit electrode patterns 16A to 16C and the projecting electrodes 14A to 14C are formed by electroplating. For example, the circuit electrode patterns 16A to 16C are formed by plating nickel (Ni), gold (Au), nickel (Ni), copper (Cu), nickel, and gold in this order, and the projecting electrodes 14A to 14C are formed by selectively plating copper on the circuit electrode patterns 16A to 16C.

A method of producing the electronic parts mounting board 100 will be described below. FIGS. 2A to 2J are sectional views showing steps of producing the electronic parts mounting board 100 according to one embodiment of the present invention. In this embodiment, the projecting electrodes 14A to 14C are obtained by selectively forming stepwise tapered resist cavities over the circuit electrode patterns 16A to 16C, and burying the cavities with copper at a time by copper plating.

Figure 2A:
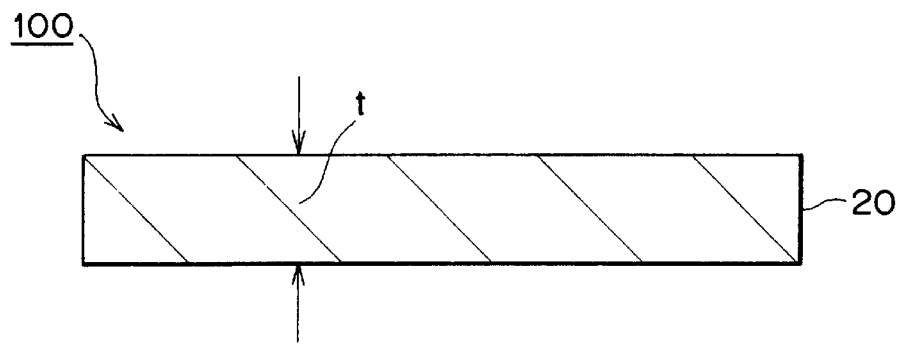
FIGS. 2A to 2J are views showing steps of producing the electronic parts mounting board shown in FIG. 1.

First, a copper foil (thin copper plate) 20 having a thickness of "t", which is one example of a conductive base member capable of being plated and etched, is prepared as shown in FIG. 2A. The thickness "t" of the copper foil 20 is set to 125 $\mu$m in this embodiment. The thickness "t", however, may be set in a range of about 100 to 200 $\mu$m. The copper foil 20 becomes the above-described temporary circuit electrode board in the process of producing the electronic parts mounting board 100.

Figure 2B:
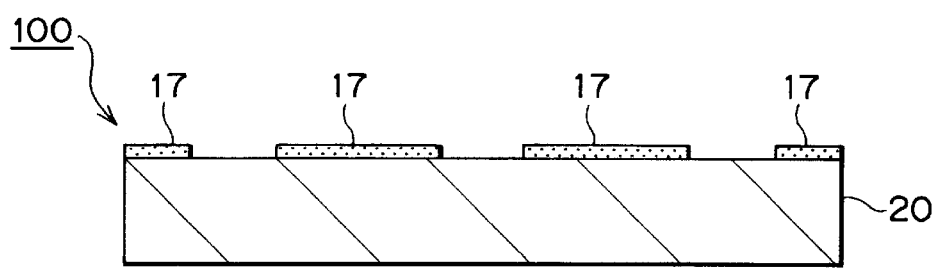

Referring to FIG. 2B, one surface of the copper foil 20 is coated with a resist, which is one example of a first non-plated member, and the resist is patterned by photolithography. It is to be noted that a back surface and side surfaces of the copper foil 20 are also required to be coated with the resist; however, they are omitted in FIG. 2B and later views for simplicity of the description.

The overall surface of the copper foil 20 is coated with a resist. The resist is exposed using, as a mask, a reticle on which specific circuit electrode patterns have been formed by baking, and is developed. An unnecessary portion of the resist film is then removed. As a result, resist patterns 17, which are reversed to the specific circuit electrode patterns, are formed on one surface of the copper foil 20.

Figure 2C:
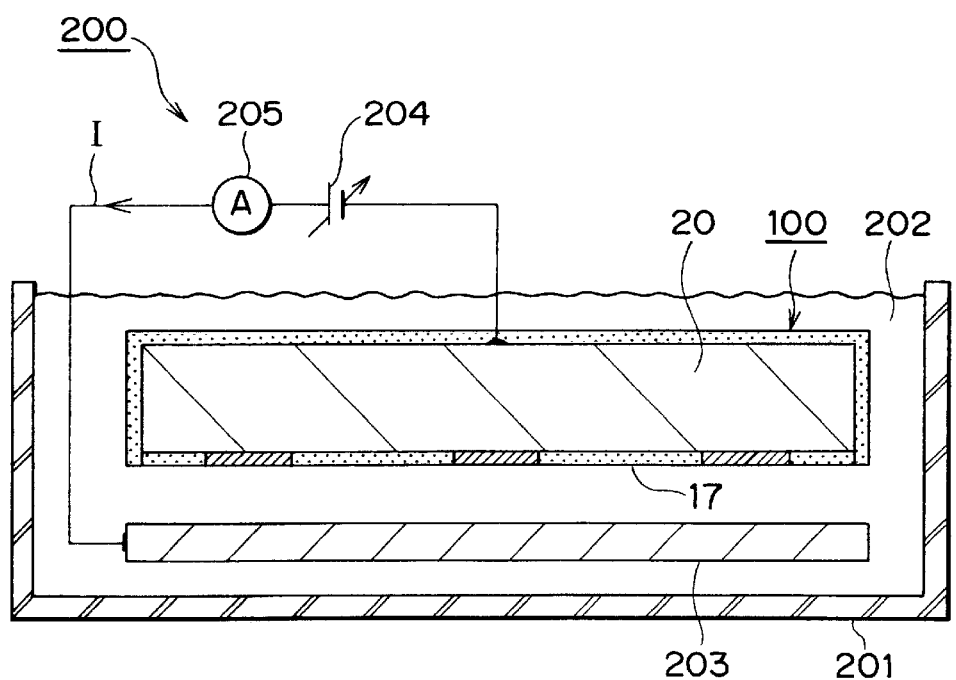

Referring to FIG. 2C, the copper foil 20 is set in an electroplating apparatus 200, and a specific conductive material is grown on the copper foil 20 by plating using the resist patterns 17 as a mask. The plating may be performed in accordance with a known electroplating process. A plating bath 201 of the electroplating apparatus 200 is filled with an electrolytic solution 202, in which an anode 203 is dipped. A DC power source 204 and a current meter 205 are provided outside the electroplating apparatus 200. The specific conductive material may be used as the anode 203.

The copper foil 20 as a plating base member is connected to a minus terminal of the DC power supply 204, and the anode 203 is connected to a plus terminal of the DC power supply 204 via the current meter 205. The electrolytic solution is exchanged depending on the kind of the conductive material to be plated. In this embodiment, gold, nickel and copper are used as the conductive materials (plating materials). Thus, Ni, Au, Ni, Cu, Ni, and Au are plated in this order on the copper foil 20 provided with the resist patterns 17.

At this time, a plating current I at the time of plating each plating material is adjusted on the basis of a value of the current meter 205, to adjust the thickness of a deposit layer of each plating material, thereby controlling the total thickness of the circuit electrode patterns 16A to 16C. The thickness of a deposit layer of each plating material becomes large by increasing the plating current I and prolonging the current carrying time, thereby increasing the plated amount. The circuit electrode patterns 16A to 16C can be made thicker than those obtained by etching the copper foil using resist patterns as a mask.

The resist is then removed. The circuit electrode patterns 16A to 16C are thus formed on the one surface of the copper foil 20 by stacking Ni, Au, Ni, Cu, Ni, and Au layers in this order. The copper foil 20, on which the circuit electrode patterns 16A to 16C have been formed by plating, is hereinafter also referred to as "circuit electrode board 20'".

Figure 2D:
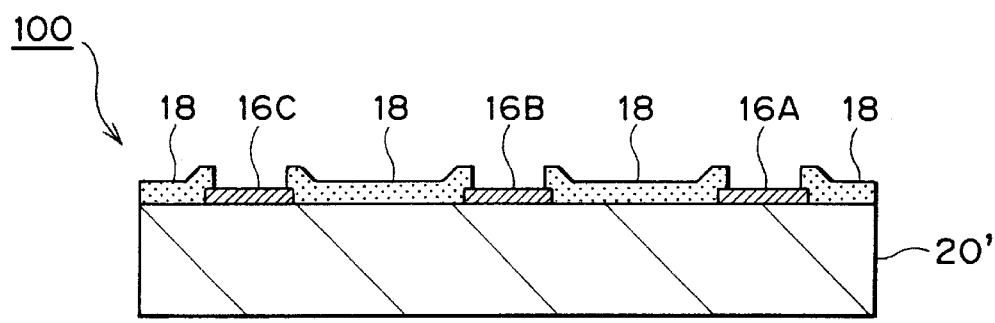

Projecting bump electrodes 14A to 14C for connection are formed on the circuit electrode board 20' as follows. First, as shown in FIG. 2D, a sheet-like resist film 18 having a specific opening width, which is one example of a second non-plated member, is selectively formed on the circuit electrode patterns 16A to 16C of the circuit electrode board 20'. A dry film is used as the resist film 18. To form each of the bump electrodes 14A to 14C into a shape closer to a cone shape, the shape of each opening formed in the resist film 18 may be circular shape or an elliptic shape. However, the opening shape may be a rectangular shape.

Figure 2E:
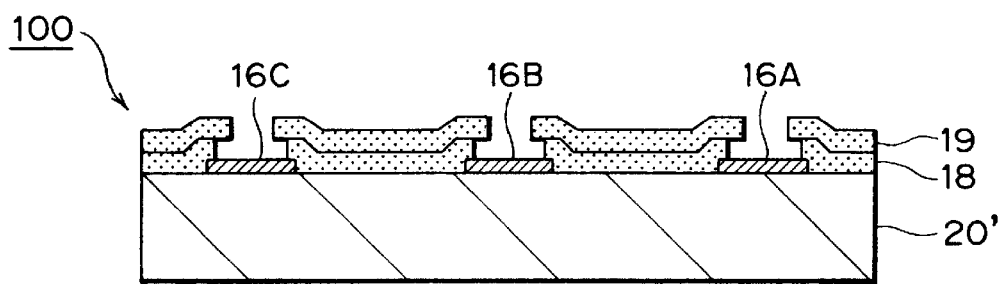
Figure 2F:
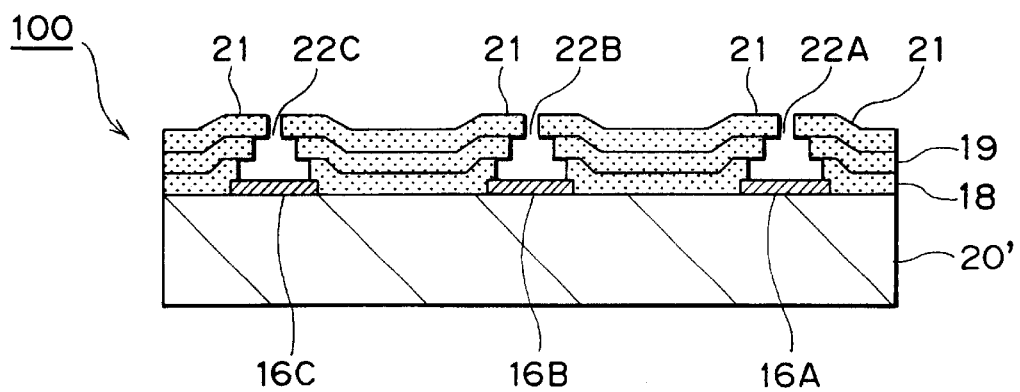

Referring to FIG. 2E, a sheet-like resist film 19 having an opening width narrower than that of the first layer resist film 18 shown in FIG. 2D is stacked on the first layer resist film 18. To be more specific, the resist film 18 having larger windows are covered with the resist film 19 having slightly smaller windows in such a manner that the windows of the resist film 18 are aligned with the windows of the resist film 19. Referring to FIG. 2F, a resist film 21 having an opening width narrower than that of the resist film 19 is stacked on the resist film 19. To be more specific, the resist film 19 having slightly smaller windows are covered with the resist film 21 having smaller windows in such a manner that the windows of the resist film 19 are aligned with the windows of the resist film 21.

As shown in FIG. 2F, a resist cavity 22A, which is stepwise tapered (projects in the shape similar to a conical shape), is thus selectively formed over the circuit electrode pattern 16A. Similarly, a resist cavity 22B is selectively formed over the circuit electrode pattern 16B, and a resist cavity 22C is selectively formed over the circuit electrode pattern 16C. In this way, projecting cavities 22A to 22C are formed at a time by electroplating.

Figure 2G:
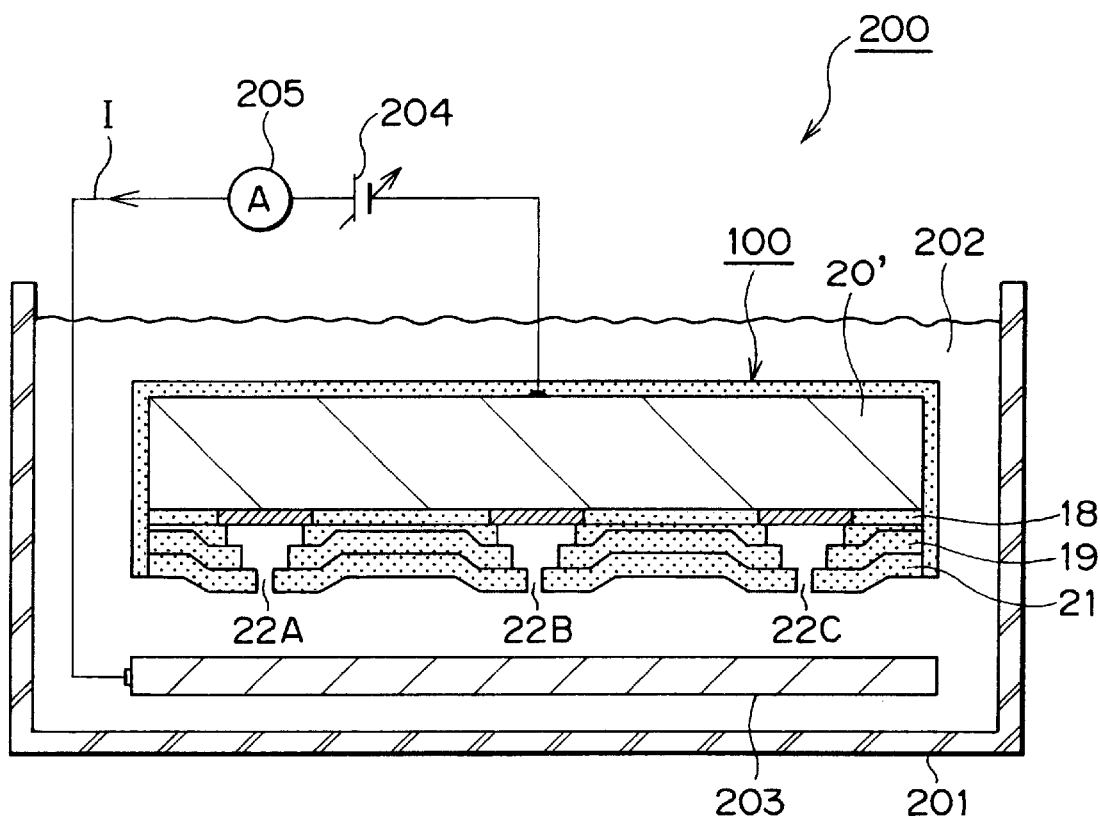

The circuit electrode board 20' is set in the electroplating apparatus 200 shown in FIG. 2G, and a specific conductive material is plated on the circuit electrode patterns 16A to 16C using the stacked resist films 18, 19 and 21 as a mask. A solution of copper sulfate is used as an electrolytic solution 202. In this embodiment, copper is used as the conductive material (plating material), and Cu is plated on the circuit electrode board 20' on which the resist films 18, 19 and 21 have been patterned.

At this time, a plating rate of copper plated in the projecting resist cavities 22A to 22C is controlled by adjusting a plating current I. For example, to uniformly grow plating, the plating current I may be set to be large at the initial stage, and to become small as nearing the end of plating, or set to be constant from the start to the end of plating.

Figure 2H:
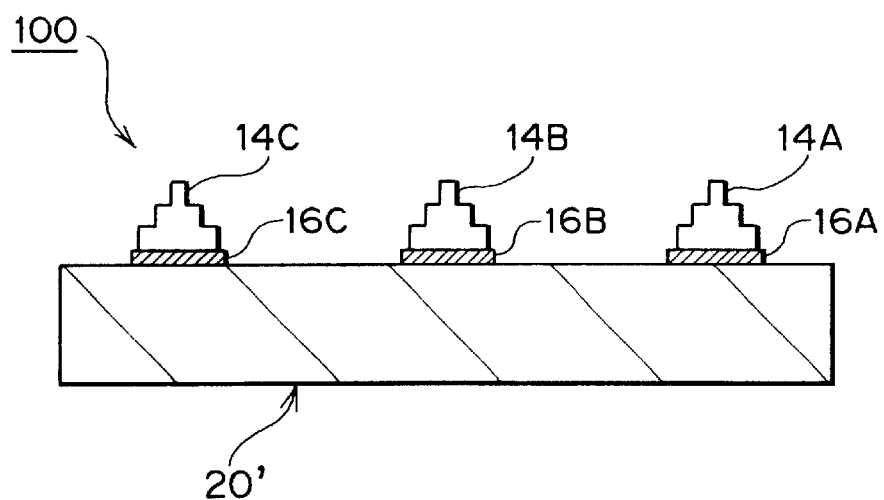

After the plating is ended, the resist films 18, 19 and 21 are removed. As shown in FIG. 2H, projecting bump electrodes 14A to 14C for connection are formed on the circuit electrode patterns 16A to 16C, respectively. Tips of the bump electrodes 14A to 14C may be sharpened by chemical polishing or electrolytic polishing, to obtain the bump electrodes 14A to 14C having sharp conical shapes. The sharpened tips of the conical bump electrodes 14A to 14C are effective to easily stave the thermal bonding member in the subsequent step.

Figure 2I:
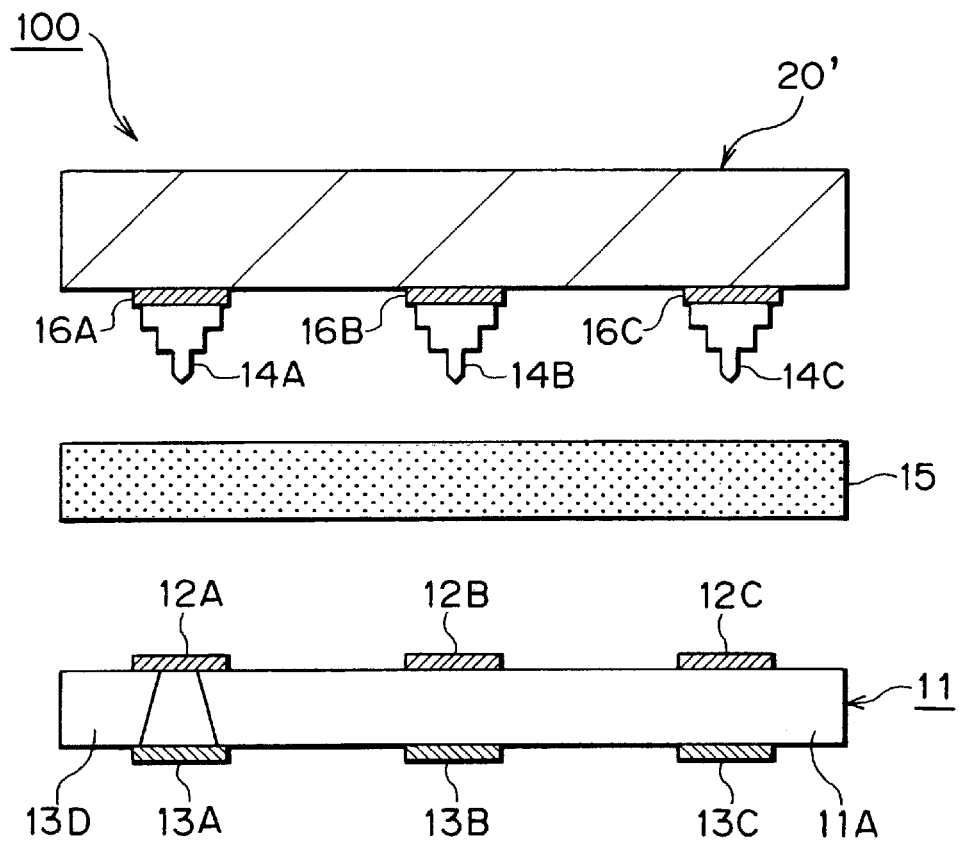

The subsequent steps may be the same as those in the related art method. Referring to FIG. 2I, an insulating thermal bonding member (insulating member) 15 is put between the circuit electrode board 20' and a specific core member 11. The thermal bonding member 15 is made from a thermosetting insulating resin such as a prepreg. The thermal bonding member 15 may be formed by screen printing. The core member 11 has electrodes 12A to 12C for connection on the front surface of an interlayer insulating member 11A and has circuit electrode patterns 13A to 13C on the back surface thereof. The electrode 12A is connected to the circuit electrode pattern 13A by means of a bump electrode 13D. The core member 11 has such a core structure for an inner layer.

After the thermal bonding material 15 is put between the circuit electrode board 20' and the specific core member 11, the circuit electrode board 20' is hot-pressed to the core member 11 in such a manner that the bump electrodes 14A to 14C of the circuit electrode board 20' reach the electrodes 12A to 12C of the core member 11, respectively, whereby the circuit electrode board 20' is bonded to the core member 11.

The bonding condition is set as follows: namely, the state that the circuit electrode board 20' is hot-pressed to the core member 11 at a pressure of 40 to 60 kg/cm$^2$ and a temperature of 170 to 180° C. is kept for about 30 min. With this hot-pressing, the circuit electrode board 20' is adhesively bonded to the core member 11. At this time, irregularities such as the electrodes 12A to 12C of the core member 11 and the circuit electrode patterns 16A to 16C are buried in the thermosetting insulating resin layer, thereby enhancing the flatness of a final electronic parts mounting board.

Figure 2J:
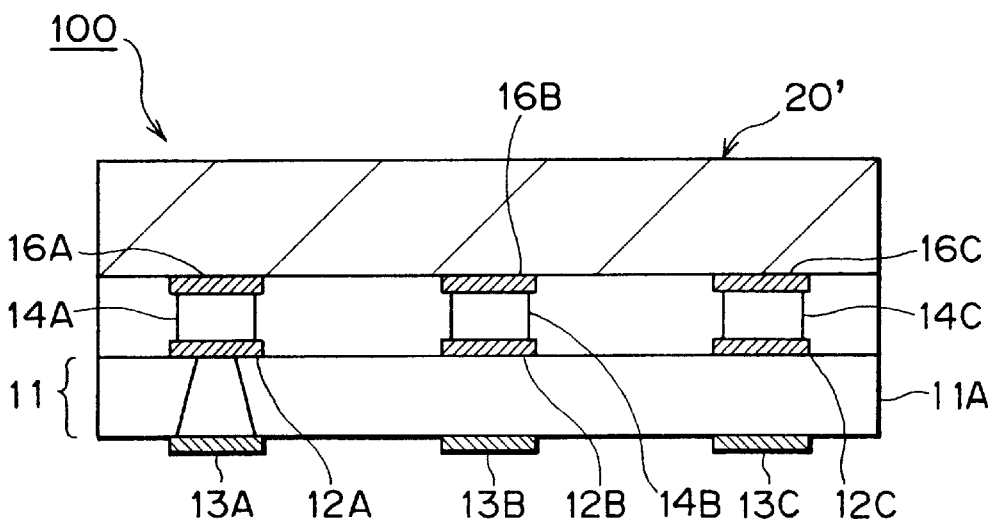
Figure 3:
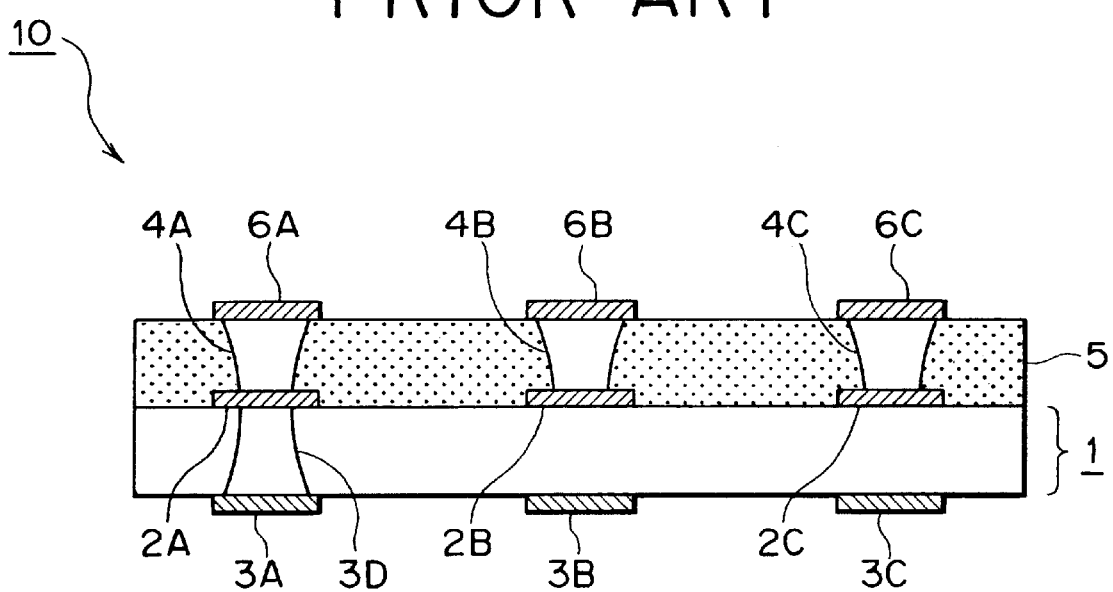
FIG. 3 is a sectional view showing a configuration example of a related art multilayer wiring board.
Figure 4A:
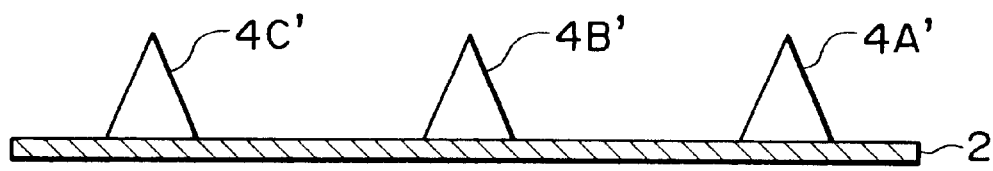
FIGS. 4A and 4B are views showing a bonding step for the multilayer wiring board shown in FIG. 3.
Figure 4B:
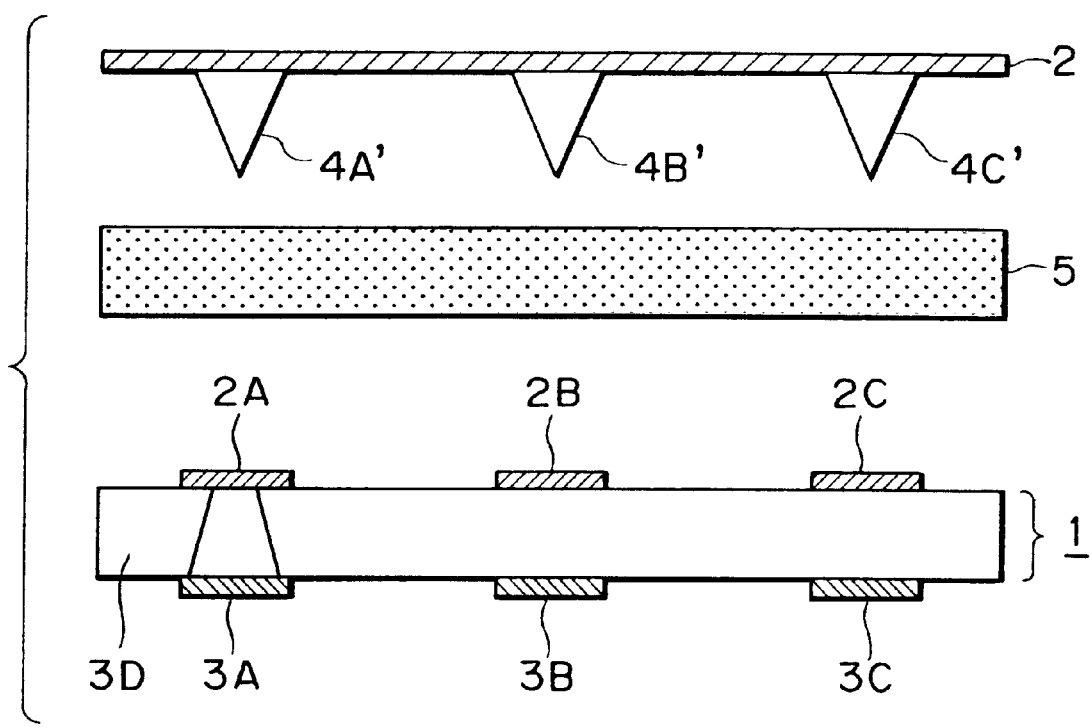

Referring to FIG. 2J, the copper foil 20 used as the temporary board is removed by overall etching, from the multilayer wiring board obtained by adhesively bonding the circuit electrode board 20' to the core member 11. Copper is etched by using, as an etching solution, an alkali solution kept at 45° C. The alkali solution is obtained by diluting a specialized etchant in ammonia at a pH of about 8.0 to 8.5. Nickel is etched by using, as an etching solution, a specialized acidic etchant kept at 35° C.

A buildup type multilayer wiring board shown in FIG. 1, which is suitable for use in portable telephones and portable terminal devices is obtained. In the case of obtaining a multilayer wiring board having a larger number of stacked layers, the above-described steps may be repeated.

As described above, according to the electronic parts mounting board 100 as the embodiment of the present invention, the circuit electrode patterns 16A to 16C can be substantially integrated with the bump electrodes 14A to 14C, respectively, by electroplating, and the bump electrodes 14A to 14C thus integrated with the circuit electrode patterns 16A to 16C can be adhesively bonded to the electrodes 12A to 12C of the core member 11, respectively, by hot-pressing. Accordingly, it is possible to obtain the electronic parts mounting board 100 having an electrode connection structure with a contact resistance almost negligible.

Since the irregularities such as the electrodes 12A to 12C of the core member 11 and the circuit electrode patterns 16A to 16C can be buried in the thermal bonding member 15, it is possible to obtain the electronic parts mounting board 100 of a very thin type excellent in flatness and adhesive force.

According to the method of producing the electronic parts mounting board 100, blind contacts having small diameters comparable to those obtained by the photo via process can be obtained at a high relative positional accuracy without use of an expensive laser system for drilling. The adhesive forces between the circuit electrode patterns 16A to 16C and the bump electrodes 14A to 14C can be also significantly improved Since the copper foil 20 used as the temporary board is removed by overall etching from the multilayer wiring board obtained by bonding the circuit electrode board 20' to the core member 11, it is possible to produce the electronic parts mounting board 100 excellent in flatness and adhesive force at a high repeatability, and hence to sufficiently keep up with mass-production of the electronic parts mounting boards 100.

In the embodiment, the resist cavities 22A to 22C each of which is formed by the openings different in width of the stacked sheet-like resist layers are formed and then buried with copper at a time by copper plating; however, the present invention is not limited thereto but may be configured as follows: namely, a resist patterning and plating step of forming a resist film by using a liquid resist, followed by exposure and development, to pattern the resist film, and plating copper using the resist pattern is repeated by several times, to form bump plating layers which are stepwise tapered, thereby forming each projecting bump electrode.

What is claimed is:

1. A method of producing an electronics parts mounting board, comprising the steps of:

forming a circuit electrode board by forming a specific circuit electrode pattern on a surface of one side of a conductive base member to be plated and etched, by plating a specific conductive material thereon;

selectively forming a non-plated material on said circuit electrode board on which said circuit electrode pattern has been formed;

forming a projecting electrode for connection on said circuit electrode pattern by plating a specific conductive material on said circuit electrode pattern with said non-plated material used as a mask;

after removing said non-plated material, putting an insulating thermal bonding member between said circuit electrode board and a specific electrode circuit base member, pressing said projecting electrode of said circuit electrode board into said thermal bonding member so as to reach said electrode circuit base member, to bond said circuit electrode board to said electrode circuit base member; and removing said entire conductive base member from a multilayer board obtained by bonding said circuit electrode board to said electrode circuit base member by etching.

2. A method of producing an electronic parts mounting board according to claim 1, wherein said circuit electrode pattern and said projecting electrode are formed by electroplating, and thicknesses of said circuit electrode pattern and said projecting electrode are controlled by adjusting a plating current.

3. A method of producing an electronic parts mounting board according to claim 1, wherein said circuit electrode pattern is formed by plating nickel, gold, nickel, copper, nickel, and gold in this order on said conductive base member.

4. A method of producing an electronic parts mounting board according to claim 1, wherein said projecting electrode is formed by selectively plating copper on said circuit electrode pattern.

5. A method of producing an electronic parts mounting board according to claim 1, wherein said electrode circuit base member is a core member for an inner layer, which has a circuit electrode pattern.

6. A method of producing an electronic parts mounting board according to claim 1, wherein said circuit electrode pattern is formed by plating a conductive material on said base member with said non-plated member used as a mask after selectively forming a first non plated member on said conductive base member.

7. A method of producing an electronic parts mounting board according to claim 6, wherein a sheet-like second non-plated member having a specific opening width is selectively formed on said circuit electrode pattern.

8. A method of producing an electronic parts mounting board according to claim 7, wherein a plurality of sheet-like non-plated members having the specific opening widths sequentially narrowed are selectively stacked on said second non-plated member.

* * * * *